United States Patent
Eriksen et al.

(10) Patent No.: US 8,045,333 B2
(45) Date of Patent: *Oct. 25, 2011

(54) INTRINSICALLY SAFE COMPLIANT CIRCUIT ELEMENT SPACING

(75) Inventors: Christopher Lee Eriksen, Saint Paul, MN (US); Howard David Goldberg, Hamburg, MN (US); John Charles Meyer, New Prague, MN (US)

(73) Assignee: Rosemount Inc., Eden Prairie, MN (US)

( * ) Notice: Subject to any disclaimer, the term of this patent is extended or adjusted under 35 U.S.C. 154(b) by 955 days.

This patent is subject to a terminal disclaimer.

(21) Appl. No.: 12/008,836

(22) Filed: Jan. 14, 2008

(65) Prior Publication Data

US 2009/0180263 A1    Jul. 16, 2009

(51) Int. Cl.
*H05K 7/00* (2006.01)
*H05K 7/10* (2006.01)
*H05K 1/16* (2006.01)

(52) U.S. Cl. ......... 361/760; 361/765; 361/767; 361/770

(58) Field of Classification Search .......... None
See application file for complete search history.

(56) References Cited

U.S. PATENT DOCUMENTS

| | | |
|---|---|---|
| 3,983,459 A | 9/1976 | Passler |
| 4,438,999 A | 3/1984 | Lang |
| 4,895,031 A | 1/1990 | Cage |
| 5,270,847 A | 12/1993 | Sano |
| 5,420,751 A | 5/1995 | Burns |
| 5,563,445 A | 10/1996 | Iijima et al. |
| 5,901,046 A | 5/1999 | Ohta et al. |
| 5,984,692 A | 11/1999 | Kumagai et al. |
| 6,203,333 B1 * | 3/2001 | Medina et al. ............ 439/76.1 |
| 6,456,057 B1 | 9/2002 | Weber et al. |
| 6,748,813 B1 | 6/2004 | Barger et al. |
| 6,780,060 B1 * | 8/2004 | Kajiura et al. ........... 439/620.21 |
| 6,785,144 B1 * | 8/2004 | Akram ........................ 361/749 |
| 6,895,826 B1 | 5/2005 | Nakao et al. |
| 7,275,953 B2 * | 10/2007 | Brown et al. ................. 439/493 |
| 7,292,453 B2 * | 11/2007 | Naruse ......................... 361/784 |
| 7,515,433 B2 * | 4/2009 | Jornod et al. ................ 361/756 |
| 7,522,804 B2 * | 4/2009 | Araki et al. .................. 385/135 |
| 2004/0165361 A1 | 8/2004 | Kimura et al. |
| 2004/0245674 A1 | 12/2004 | Yew et al. |
| 2005/0052924 A1 | 3/2005 | Nishizawa et al. |
| 2006/0038278 A1 | 2/2006 | Wang |
| 2006/0071305 A1 | 4/2006 | Ho et al. |

FOREIGN PATENT DOCUMENTS

| | | |
|---|---|---|
| EP | 0932198 A1 | 7/1999 |
| EP | 0645806 B1 | 11/2004 |

OTHER PUBLICATIONS

International Search Report—PCT/US09/00087—dated May 28, 2009—10 pages.

* cited by examiner

*Primary Examiner* — Boris Chervinsky
(74) *Attorney, Agent, or Firm* — Kinney & Lange, P.A.

(57) ABSTRACT

A compliant circuit element spacing system comprises a circuit board, a dummy spacer component, and a compliant circuit element. One or more active components are mounted to the circuit board. The dummy spacer component is also mounted to the circuit board, such that the dummy spacer component is electrically isolated from each active component mounted to the circuit board. The compliant circuit element is positionable proximate the circuit board, and spaced from the circuit board by the dummy spacer component. The spacing component isolates the compliant circuit element from each active component mounted to the circuit board.

22 Claims, 2 Drawing Sheets

INTRINSICALLY SAFE COMPLIANT CIRCUIT ELEMENT SPACING

BACKGROUND OF THE INVENTION

This invention relates generally to electronic systems, and specifically to spacing techniques for electronic circuit components. In particular, the invention concerns an intrinsically safe compliant circuit element spacing system, which is applicable to general-purpose electronics devices including field devices and transmitters for industrial process control and monitoring applications.

Field devices include a broad range of process management devices designed to measure and control fluid parameters such as pressure, temperature and flow rate. Field devices have broad utility in manufacturing, food and beverage processing, environmental control, hydrocarbon processing and other areas, spanning a wide range of process materials including air, water, edibles and potables, bulk materials, liquid and gaseous fuels, glues, resins, thin films, and thermoplastics such as PVC (polyvinyl chloride) and polyethylene.

In general, field devices include transmitters, which are configured to measure or sense a process parameter with a sensor module, and controllers, which are configured to modify or control such a parameter with a control module (for example, by positioning a valve or regulating a pressure). Field devices also include multi-sensor transmitters such as pressure/temperature transmitters, and integrated controllers comprising both sensor modules and control modules (for example, integrated flow controllers or hydrostatic tank gauge systems).

The "intrinsically safe" designation is applied to field devices certified under one or more standards for operation in hazardous locations, including locations prone to explosive atmospheres. These standards include, but are not limited to, FM (Factory Mutual), CSA (Canadian Standards Association), SAA/SA (Standards Association of Australia/Standards of Australia), TIIS (Japanese Technology Institution of Industrial Safety), CENELEC (European Committee for Electrotechnical Standardization), and ATEX (Appareils destinés à être utilisés en ATmosphères EXplosibles) standards.

Intrinsically safe field devices are designed to prevent the release of sufficient electrical or thermal energy to cause ignition of a hazardous atmosphere in its most ignitable concentration. Simple devices such as switches, thermocouples, RTDs and resistors typically attain an intrinsically safe rating by imposing direct limits on voltage, current and stored energy. Non-simple devices (including transmitters, controllers and other field devices) also restrict the inductance and capacitance of individual electronic components, reduce thermal output, and utilize intrinsically safe field wiring barriers to lower internal voltages and currents.

In addition, intrinsically safe field devices also address component spacing, particularly with respect to compliant circuit elements. Intrinsically safe spacing isolates circuit elements from other active electronic components, in order to prevent sparking, resistive heating, and other potentially hazardous effects.

Typical intrinsically safe spacing methods utilize insulating or filler materials such as epoxies, epoxy-elastomer potting compounds, resistive films, resistive tapes, and solid plastic spacers. Unfortunately, these materials require additional manufacturing and assembly steps, adding cost and complexity to the end product. Moreover, different spacing materials are often required for different operating environments, and their inclusion can significantly increase the difficulty of diagnosing, accessing and repairing electronic faults. There remains a need, therefore, for low-cost component spacing techniques that are applicable to a wide range of electronic designs, and able to provide intrinsically safe spacing in a variety of different hazardous location applications.

BRIEF SUMMARY OF THE INVENTION

The present invention concerns a system for electronic component spacing, applicable to compliant circuit elements for field devices and other general-purpose measurement and control applications. The system comprises a circuit board and a compliant circuit element that is spaced from the circuit board by a dummy spacer component.

One or more active components are mounted to the circuit board. The dummy spacer component is also mounted to the circuit board, but is electrically isolated from the active components. The compliant circuit element is positionable proximate the circuit board, and spaced from the circuit board by the dummy spacer component. The dummy spacer component isolates the compliant circuit element from the circuit board by maintaining a minimum separation with respect to each active component mounted to the circuit board.

DETAILED DESCRIPTION

Figure 1:
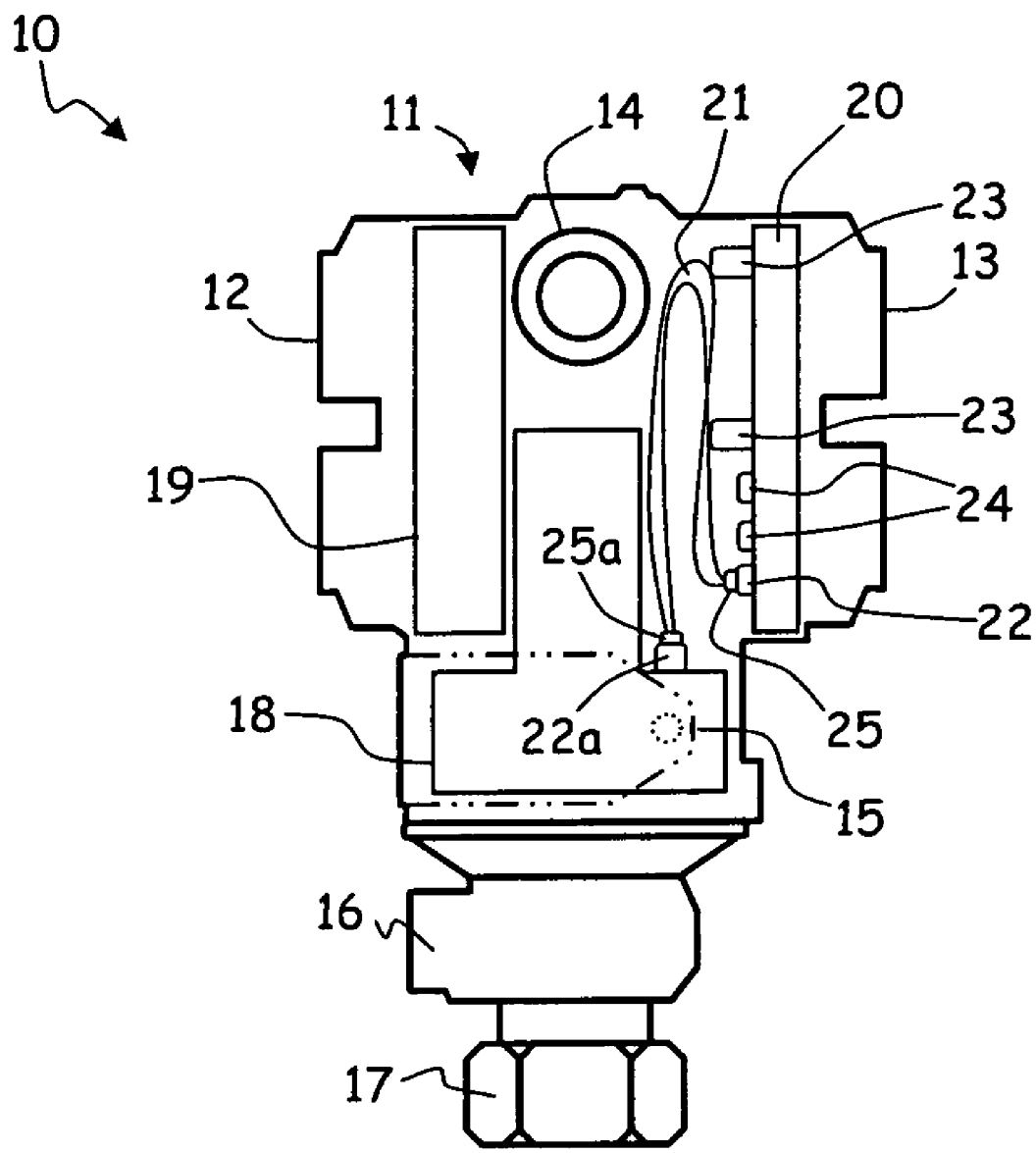
FIG. 1 is a cross-sectional schematic of a field device utilizing intrinsically safe compliant circuit element spacing.

FIG. 1 is a cross-sectional schematic of field device 10 utilizing intrinsically safe compliant element spacing. In this embodiment, field device 10 comprises housing 11 with terminal cover 12, transmitter cover 13, conduit connection 14, nameplate 15 (shown in phantom lines), mount 16 and coupling nut 17. Within housing 11 are comprised internal transmitter elements including primary sensor module (or primary sensor) 18, terminal block 19 and circuit board (or electronics board) 20, which provides inherently safe spacing for compliant circuit element 21.

Housing 11 is comprised of a durable material such as metal or a durable plastic. The housing insulates internal components of the field device, shields them from adverse environmental conditions such as moisture or corrosive agents, and protects them from contact with process machinery, tools, falling objects, or other potential hazards. Housing 11 also provides internal structures configured to mount or secure primary sensor module 18, terminal block 19 and circuit board 20, and external structures such as conduit connection 14, mount 16 and coupling nut 17, which couple housing 11 to a process structure and allow primary sensor module 18 to characterize a process parameter.

Sensor module 18 is configured to generate an analog sensor signal that characterizes a physical parameter (a process parameter) associated with a fluid or other process material. In some embodiments, sensor module 18 comprises a pressure sensor such as a piezoresistive pressure sensor, a capacitive pressure sensor, or an electromechanical pressure sensor, each of which is configured to characterize or measure a process pressure. Alternatively, sensor module 18 comprises a temperature sensor such as a thermocouple or resistance-temperature device (RTD), a flow meter such as a mass flow meter or Coriolis flow meter, a fluid level sensor, or another form of process sensor. Field device 10 also comprises multi-sensor embodiments such as pressure/temperature transmitters, which include a number of primary sensor modules 18.

As shown in FIG. 1, primary sensor module 18 is configured to characterize a process pressure, and field device 10 is a pressure transmitter. In this embodiment, circuit board/electronics board 20 also represents an interface, and is configured to communicate the process parameter (that is, to communicate an output representative of the parameter) to a process control system using a standard communications protocol such as Fieldbus, HART® or PROFIBUS. A wide range of such transmitters and field devices are available, for example, from Rosemount, Inc., of Chanhassen, Minn., an Emerson Process Management company.

In certain transmitter embodiments, field device 10 is a Rosemount 3051-series pressure transmitter. This example is, however, merely illustrative, and the relative sizes, shapes and positions of the components in FIG. 1 illustrate a wide range of potential field device configurations. In other embodiments, circuit board 20 and compliant circuit element 21 are utilized in a temperature transmitter, a flow meter, a valve controller, an integrated flow controller, or another generalized field device. In further embodiments, circuit board 20 and compliant circuit element 21 are provided independently of any transmitter, controller, or field device (see, e.g., FIG. 2).

Circuit board/electronics board 20 is typically a printed circuit assembly (PCA) comprising a printed circuit board (PCB) and a number of active components 24 connected by conducting pathways or active traces. The PCB is typically laminated, with a number of insulating layers, made of fiberglass or cellulose impregnated with resin or epoxy, alternating with a number of conducting layers, made of copper or another conducting metal. Some of the conducting layers are planar, such as ground planes or power planes, or dedicated inactive planes for pinning components to a desired potential or voltage. Other conducting layers, including but not limited to surface layers, contain traces that connect the various components.

As shown in FIG. 1, circuit board 20 comprises header 22, spacing component 23 and at least one active component 24, each of which is mounted to circuit board 20 via a standard electronics manufacturing process such as soldering, wave soldering, wire wrapping or surface mounting. Compliant circuit element 21 is a flex circuit or other circuit element that is easily deformable or otherwise continuously positionable proximate circuit board 20; that is, compliant circuit element 21 is positioned adjacent circuit board 20 but is not rigidly mounted. Thus the position of compliant circuit element 21 with respect to circuit board 20 varies along the length of element 21, as a function of the position of various structural or electronic elements near circuit board 20. In some embodiments, the position of compliant circuit element 21 is also as a function of time, due to changes in the relative positions of these various components, due to changing ambient conditions such as temperature and pressure, or due to vibrational effects.

In some embodiments, compliant circuit element 21 is configured to connect circuit board 20 with another electronic element. In these embodiments, compliant circuit element 21 typically comprises second connector 25a, which couples to second header 22a. Second header 22a has various locations, as exemplified in FIG. 1 by a location on primary sensor module 18. In other embodiments, the connection is formed to terminal block 19, to another location on circuit board 20, or to another electronic element of transmitter 10.

Compliant circuit element 21 is typically elongated, such that its position with respect to circuit board 20 varies along its length. This allows compliant circuit element 21 to accommodate different physical configurations within field device 10, as well as rotation or other relative motion of the various internal and external components. In each operational configuration, spacing component 23 provides a minimum space or gap between compliant circuit element 21 and circuit board 20, isolating active components 24 of circuit board 20 from physical contact or electrical connection with compliant circuit element 21, as discussed in more detail with respect to FIG. 2, below.

In some embodiments, at least one spacing component 23 also provides intrinsically safe spacing between compliant circuit element 21 and a chassis, case, or other component of housing 11. In these embodiments, the position of each dummy spacer component 23 is determined to restrict the position of compliant circuit element 21 with respect to both circuit board 20 and housing 11, such that intrinsically safe spacing is maintained between compliant circuit element 21 and circuit board 20, and between compliant circuit element 21 and housing 11. That is, spacing components 23 maintain a minimum spacing to isolate compliant circuit element 21 from both circuit board 20 and housing 11.

Typically, circuit board 20 is soldered or otherwise mechanically attached to the chassis or to another component of housing 11, and the mechanical attachment sometimes performs additional functions such as forming a pressure seal, a vapor barrier, or an electrical attachment between housing 11 and a trace or plane on circuit board 20. In some of these embodiments, circuit board 20 is generally circular in shape, and the chassis component has an annular or cylindrical shape to create an annular pressure seal or vapor barrier around circuit board 20. In alternate embodiments, the particular geometries of circuit board 20 and housing 11 vary, as do any additional functions of the mechanical attachment.

Figure 2:
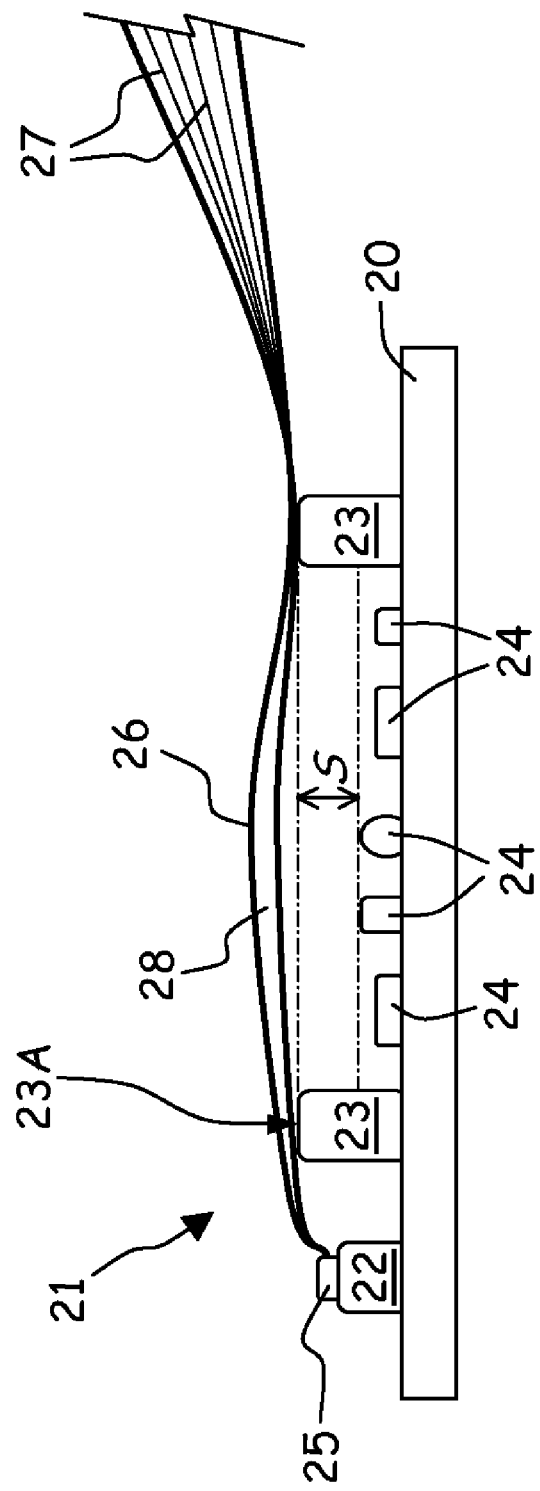
FIG. 2 is an enlarged schematic view of a circuit board and compliant circuit element for the field device in FIG. 1.

FIG. 2 is an enlarged view of circuit board 20 and compliant circuit element 21. In this embodiment, circuit board 20 has header 22, spacing components 23 and at least one active component 24, each mounted on circuit board 20 as described above with respect to FIG. 1. Compliant circuit element 21 is coupled to header 22 via connector 25.

Components 23 and 24 are typically commercial off-the-shelf (COTS) electronic components, comprising resistors, capacitors, inductors, monostable multivibrators (clock generators), and other discrete electronic components, or integrated circuit (IC) components. Spacing components 23 and active components 24 encompass a variety of commercially available architectures, including, but not limited to, dual-in-line package (DIP) and surface mount (SMT) architectures.

As shown in FIG. 2, compliant circuit element 21 comprises connector 25 and compliant circuit body 26 with compliant traces 27. Compliant circuit element 21 is coupled to circuit board 20 via electrical or electrical and mechanical couplings between connector 25 and header 22. This configuration is, however, merely representative. In alternate embodiments, compliant circuit body 26 and compliant traces 27 are directly connected to header 22, without connector 25, or directly connected to circuit board 20, without connector 25 or header 22.

Similarly, in some embodiments compliant circuit element 21 forms an electrical connection with another electronic element (or another location on circuit board 20) via a second header and a second connector, as shown in FIG. 1. The other electronic element is variously a field device or transmitter element, or a general-purpose electronic device for measurement, control, audio or video reproduction, or another purpose.

In other embodiments, the second connection is made directly to a second header, or directly to another electronics element, without either a header or a connector. In further embodiments, compliant circuit element 21 is continuously positionable with respect to circuit board 20, but does not necessarily form a connection to any other electronic element.

Compliant circuit body 26 is usually comprised of a flexible, insulating material forming a substrate or underlying film or layer. One suitable material is a polyimide, as available, for example, from the DuPont Corporation of Wilmington, Del., under the trade name Kapton®.

In some embodiments, compliant circuit body 26 comprises conductive ground plane 28, formed on one side of the substrate, and conductive compliant traces 27, extending longitudinally on the other side of the substrate. In other embodiments, compliant traces 27 are provided on one side of the substrate, without a ground plane. An additional flexible insulating outer layer (not shown) is sometimes provided to cover compliant traces 27, ground plane 28, or both. In some of these embodiments, compliant circuit element 21 sometimes comprises a flat or generally planar ribbon cable, in which traces 27 represent conductive wires.

In the particular embodiment of FIG. 2, compliant circuit body 26 extends from header 22 and connector 25 generally parallel to the surface of circuit board 20. Alternatively, compliant circuit body 26 extends generally perpendicular to the surface of circuit board 20, as shown in FIG. 1, or in some other direction with respect to the surface.

The intrinsically safe spacing techniques described here provide a physical spacing (or gap) between compliant circuit body 26 and active component(s) 24 on circuit board 20, in order to isolate each active component mounted to circuit board 20 from compliant circuit element 21. Specifically, the gap between circuit board 20 and compliant circuit body 21, as measured between any active component 24 and compliant circuit body 26, meets or exceeds required minimum spacing S.

Spacing components 23 provide inherently safe spacing in order to protect against accidental or unintended electrical connections between any compliant trace 27 and any active component 24 on circuit board 20. This protects against effects such as sparking or resistive heating, which can result in ignition of an explosive or combustible atmosphere. More generally, spacing components 23 provide a redundant safety measure to protect against contact, whether electrical, physical, thermal, abrasive or otherwise, between compliant circuit element 21 and active components 24 (or active traces connecting active components 24) on circuit board 20.

Active components 24 are mounted on circuit board 20 such that they are electrically coupled to at least one active trace or lead on circuit board 20. The active traces form electrical connections among various active components 24 and header 22. Components 24 and header 22 are also typically connected to a ground trace, a ground plane or a ground bus, and intrinsically safe spacing is also maintained with respect to the ground trace, ground plane, or ground bus.

In contrast to active components 24, spacing components 23 are mounted to circuit board 20 such that they are isolated from (not electrically connected to) any active component or active trace on circuit board 20. Instead, spacing components 23 are mounted on circuit board 20 in order to maintain intrinsically safe spacing with respect to compliant circuit element 21. Thus spacing components 23 are "dummy" spacing components, which perform an inherently safe spacing function on circuit board 20, rather than the electronic function for which they were manufactured.

Typically, dummy spacer components 23 are mounted to localized pads or pin connectors that terminate immediately proximate the spacing component, and are spaced from active leads and active components 24 by an electrically insulating gap. In these embodiments, spacing components 23 often float; that is, they spontaneously attain a voltage that is typically non-zero with respect to ground, as defined by a ground plane, trace or bus on the circuit board.

In alternate embodiments, one or more pins or leads on spacing components 23 are pinned by connecting to a dedicated inactive plane, trace or bus that is electrically isolated from active components 24 and any active plane, trace or bus. In these embodiments, the dedicated inactive plane, trace or bus is sometimes held at a desired voltage, such that spacing component 23 is prevented from floating, drifting or otherwise attaining an undesirable voltage with respect to circuit board 20 or compliant circuit element 21.

Each spacing component 23 has a profile height that is sufficient to maintain minimum spacing S. That is, the profile height of dummy spacer component 23 with respect to circuit board 20 is greater than the profile height of each active component 24, such that the profile height of dummy spacer component 23 is at least as great as the greatest profile height of any active component 24, plus minimum spacing S. Thus spacing components 23 physically and electrically isolate compliant circuit element 21 from circuit board 20, where the isolation gap (minimum spacing S) is a function of profile height.

In particular, at least one spacing component 23 maintains a minimum spacing between compliant circuit element 21 and circuit board 20, such that compliant circuit body 26 is physically isolated from physical contact with circuit board 20 and active components 24, and compliant traces 27 are electrically isolated from electrical connection with active components 24, from any active traces connected to active components 24, and from any ground plane, trace or bus on circuit board 20. In some embodiments, at least one spacing component 23 also maintains a minimum spacing between compliant circuit element 21 and a chassis or other component of a housing, as described above with respect to FIG. 1.

Within these limitations, the shape and geometry of each individual spacing component 23 varies. In some embodiments, spacing components 23 are high-profile components that extend as far or farther in a perpendicular direction from circuit board 20 than does header 22, as shown in FIG. 2. In other embodiments, spacing components 23 maintain minimum spacing S but are lower in profile than header 22. Similarly, in some embodiments header 22 has sufficiently high profile to maintain minimum spacing S in combination with spacing component 23, and in other embodiments header 22 has a lower profile, or header 22 is absent as described above.

The number of spacing components 23 also varies. In some embodiments, there are two spacing components 23, as shown in FIGS. 1 and 2. In other embodiments, there is one spacing component 23, or three or more spacing components 23. Each is positioned as appropriate to the particular configuration of compliant circuit element 21, circuit board 20, active components 24, and other nearby electronics components, chassis/housing structures, or sensor elements.

Suitable choices for dummy spacer components 23 include plastic-coated capacitors or other insulated components in which the pins or leads are located near the bottom (that is, proximate the surface of circuit board 20, below the profile height of any active components 24). This allows dummy spacer components 23 to maintain minimum spacing S between compliant circuit element 21 and active components or traces on circuit board 20.

In some embodiments, spacing components 23 are "spot potted" by providing an additional layer or coating of insulating material 23A. Typically, the spot potting material is a soft and/or lubricious material such an RTV (room-temperature vulcanization) silicone material. Spot potting thus protects against abrasion due to vibrations or relative motion of compliant circuit body 26 with respect to spacing components 23. In some applications, spot potting also provides additional clearance, increasing the isolation gap or minimum spacing S. In contrast to traditional potting techniques, however, spot potting is locally applied. Thus spot potting does not substantially impair or impede access to other circuit elements, such as active components 24, for the purposes of fault diagnosis and repair.

Spacing components (or dummy spacer components) 23 provide significant advantages with respect to prior art designs. In particular, dummy spacer components 23 are mounted on circuit board 20 at the same time as active components 24, using the same mounting process. This reduces manufacturing time and cost, because spacing components 23 do not require a separate assembly or manufacturing step, or different attachment techniques than those used for active components 24.

In one embodiment, both dummy spacer components 23 and active components 24 are mounted via a soldering process, including, but not limited to, traditional soldering, wave soldering and reflow soldering, as applied to a variety of component architectures including surface mount, through-hole, and ball grid array (BGA) architectures. These techniques provide a single-step method for forming mechanical attachments between spacing components 23 and circuit board 20, at the same time that mechanical and electrical connections are formed between active components 24 and circuit board 20. This distinguishes from prior art spacing techniques in which a separate attachment step is required for the spacers, such as mechanical fastening using nuts, bolts, screws, glues, or other mechanical elements.

Moreover, dummy spacer components 23 are selected on the basis of profile height, insulating properties and cost, taking advantage of pre-existing designs and supply chains, without requiring custom manufacture, specialized assembly, or even special ordering procedures. In typical embodiments, dummy spacer components 23 and active components 24 are each available as commercial off-the-shelf (COTS) units. In other applications, however, they are commercially available mil-spec components or extended mil-spec components, or, alternatively, specialized components designed for extreme conditions including, but not limited to, extreme high-temperature or low-temperature applications, highly corrosive conditions, and extremely high-pressure or low-pressure environments. This contrasts with existing techniques that use various plastic, epoxy or polyimide spacing materials, because these materials are not typically suitable for all operating environments. On the other hand, because dummy spacer components 23 are selected from the same stock as active components 24, they are inherently suited for the same range of operational conditions.

Spacing components 23 are also adaptable to a wide variety of inherently safe spacing applications. While FIG. 2 shows a single compliant circuit element 21 with compliant traces 27, for example, in other embodiments there are multiple compliant elements. Further, while compliant circuit element 21 is shown a flexible circuit (or flex circuit), in some embodiments compliant circuit element 21 comprises a rigid circuit element, such as a rigid section of circuit board that is not independently mounted, and thus capable of continuous relative motion with respect to circuit board 20. Additionally, while both active components 24 and dummy spacer components 23 are shown as mounted to circuit board 20, in some embodiments one or more active components or dummy spacer components are also mounted to compliant circuit element 21.

The present invention has been described with reference to preferred embodiments. The terminology used is for the purposes of description, not limitation, and workers skilled in the art will recognize that changes may be made in form and detail without departing from the spirit and scope of the invention.

The invention claimed is:

1. A compliant circuit spacing system comprising:
   a circuit board;
   one or more active components mounted to the circuit board to form an electronic circuit;
   a dummy spacer component comprising an electronic component mounted to the circuit board, such that the dummy spacer component is electrically isolated from each active component mounted to the circuit board and not electrically connected to the electronic circuit; and
   a compliant circuit element positionable proximate the circuit board, wherein the compliant circuit element is spaced from the circuit board by the dummy spacer component, such that the dummy spacer component performs a spacing function on the circuit board, but not an electronic function, the dummy spacer component physically isolating the compliant circuit element from each active component mounted to the circuit board.

2. The system of claim 1, wherein the dummy spacer component and the compliant circuit element are mounted via the same soldering technique.

3. The system of claim 2, wherein the dummy spacer component comprises an electronic component selected from a group consisting of a resistor, a capacitor, an inductor and a monostable multivibrator.

4. The system of claim 1, wherein the dummy spacer component has a profile height sufficient to maintain a minimum spacing between the compliant circuit element and each active component mounted to the circuit board.

5. The system of claim 4, wherein the profile height is further sufficient to maintain a minimum spacing between the compliant circuit element and a chassis.

6. The system of claim 1, wherein the dummy spacer component is spot potted with an insulating material.

7. The system of claim 1, wherein the dummy spacer component is mounted to the circuit board with an electrically insulating gap, such that the dummy spacer component floats in voltage with respect to a ground on the circuit board.

8. The system of claim 1, wherein the dummy spacer component is pinned by connecting to a plane, trace or bus that is electrically isolated from the active components.

9. The system of claim 1, further comprising a primary sensor module electrically connected to the circuit board, and configured to generate a sensor signal that characterizes a process parameter associated with a process material.

10. The system of claim 9, wherein the primary sensor module comprises a pressure sensor.

11. An intrinsically safe electrical device comprising:
    a circuit board having active components and a dummy spacing component soldered to the circuit board, wherein the active components form an electronic circuit and the dummy spacing component comprises an electronic component that is electrically isolated from the active components and not electrically connected to the electronic circuit, the dummy spacing component having a greater profile height with respect to the circuit board than the active components; and a compliant circuit element positionable adjacent the circuit board and spaced from the circuit board by the dummy spacing component, such that the dummy spacing component performs a spacing function on the circuit board, and not an electronic function, the dummy spacing component physically isolating the compliant circuit element from the circuit board to prevent electrical connection between the compliant circuit element and the active components.

12. The device of claim 11, wherein the dummy spacing component is electrically isolated from the electronic circuit with an electrically insulating gap, such that the dummy spacing component floats in voltage with respect to the circuit board.

13. The device of claim 11, wherein the dummy spacing component comprises a capacitor.

14. The device of claim 11, wherein the circuit board is mounted within a housing, and wherein the compliant circuit element is also spaced from the housing by the dummy spacer component.

15. The device of claim 14, further comprising a primary sensor module mounted within the housing, the primary sensor module configured to generate a sensor signal that characterizes a process parameter associated with a process material.

16. An intrinsically safe field device comprising:
a housing;
a primary sensor mounted within the housing, the primary sensor configured to generate a sensor signal that characterizes a process parameter associated with a process material;
an electronics board mounted within the housing for communicating the process parameter;
at least one active component mounted on the electronics board to form an electronic circuit;
a dummy spacer component comprising an electronic component mechanically attached to the electronics board but not electrically connected to the electronic circuit, without forming an electrical connection to any active component on the electronics board; and
a flex circuit positionable proximate the electronics board, wherein the flex circuit is spaced from the electronics board by the dummy spacer component, such that the dummy spacer component performs a spacing function on the circuit board, rather than an electronic function, the dummy spacer component physically isolating the flex circuit from the electronics board.

17. The field device of claim 16, wherein the dummy spacer component maintains a minimum spacing between the flex circuit and each active component on the electronics board.

18. The field device of claim 16, wherein the dummy spacer component is electrically isolated from the electronic circuit with an electrically insulating gap, such that the dummy spacer component floats in voltage with respect to the electronics board.

19. The field device of claim 16, wherein the dummy spacer component is spot potted with an RTV material.

20. The field device of claim 16, wherein the primary sensor comprises a pressure sensor.

21. A method for maintaining inherently safe spacing between a circuit board and a compliant circuit, the method comprising:
soldering an active component and a dummy spacer component comprising an electronic component on the circuit board in a single step, such that the active component is electrically connected to at least one active trace to form an electronic circuit on the circuit board and the dummy spacer component is electrically isolated from each active trace and each active component on the circuit board, and not electrically connected to the electronic circuit;
coupling a compliant circuit element to the circuit board, wherein the compliant circuit element is positionable proximate the circuit board; and
isolating the compliant circuit element from the circuit board by providing a minimum spacing from each active component on the circuit board, as a function of a profile height of the dummy spacer component:
wherein the compliant circuit element is spaced from the circuit board by the dummy spacer component, such that the dummy spacer component performs a spacing function on the circuit board, not an electronic function, the dummy spacer component physically isolating the compliant circuit element from the circuit board.

22. The method of claim 21, further comprising spot potting the dummy spacer component to prevent abrasion of the compliant circuit element.

* * * * *